United States Patent
Lee et al.

(10) Patent No.: US 10,782,758 B2
(45) Date of Patent: Sep. 22, 2020

(54) POWER CONTROL METHOD FOR STORAGE DEVICE AND ELECTRONIC SYSTEM USING THE SAME

(71) Applicant: Wistron Corporation, New Taipei (TW)

(72) Inventors: Syu-Siang Lee, New Taipei (TW); Zh-Wei Zhang, New Taipei (TW)

(73) Assignee: Wistron Corporation, New Taipei (TW)

( * ) Notice: Subject to any disclaimer, the term of this patent is extended or adjusted under 35 U.S.C. 154(b) by 86 days.

(21) Appl. No.: 16/205,181

(22) Filed: Nov. 29, 2018

(65) Prior Publication Data

US 2020/0089294 A1    Mar. 19, 2020

(30) Foreign Application Priority Data

Sep. 13, 2018    (TW) ............... 107132277 A

(51) Int. Cl.
     *G06F 1/26*      (2006.01)
     *G06F 1/28*      (2006.01)
     *H03K 19/20*      (2006.01)

(52) U.S. Cl.
     CPC ............... *G06F 1/263* (2013.01); *G06F 1/28* (2013.01); *H03K 19/20* (2013.01)

(58) Field of Classification Search
     CPC .................................. G06F 1/263; G06F 1/28
     See application file for complete search history.

(56) References Cited

U.S. PATENT DOCUMENTS

| | | | |
|---|---|---|---|
| 9,495,369 B2 | 11/2016 | Sung et al. | |
| 2014/0344561 A1 | 11/2014 | Sung et al. | |
| 2015/0067084 A1 | 3/2015 | Yeh et al. | |
| 2015/0346795 A1* | 12/2015 | Shacham | G06F 1/3203 713/324 |
| 2015/0363109 A1* | 12/2015 | Frick | G06F 11/2015 711/112 |
| 2016/0085289 A1* | 3/2016 | Khatib | G06F 3/0688 713/320 |
| 2016/0124487 A1* | 5/2016 | Kunishige | G06F 1/3221 713/330 |
| 2019/0227611 A1* | 7/2019 | Nam | G06F 1/3268 |
| 2019/0339759 A1* | 11/2019 | Lim | H01R 13/04 |

FOREIGN PATENT DOCUMENTS

| | | |
|---|---|---|
| CN | 107480237 | 12/2017 |
| TW | 201445326 | 12/2014 |
| TW | 201511501 | 3/2015 |

OTHER PUBLICATIONS

"Office Action of Taiwan Counterpart Application," dated Jul. 25, 2019, p. 1-p. 9.

* cited by examiner

*Primary Examiner* — Glenn A. Auve
(74) *Attorney, Agent, or Firm* — JCIPRNET

(57) ABSTRACT

A framework for system power control of a dual-port non-volatile memory storage device is provided. The electronic system includes a storage device, two hosts and a control circuit within each of the two hosts. Each host filters signals for shortly turning off a power supply of the storage device during a process of boot and reboot of the host. When one of the hosts enters a turn-off state, it is detected whether another one of the hosts is running, and the one of the hosts does not control the power supply if the another one of the hosts is running. Two control signals of the two hosts control the power supply of the storage device through an AND gate.

10 Claims, 3 Drawing Sheets

POWER CONTROL METHOD FOR STORAGE DEVICE AND ELECTRONIC SYSTEM USING THE SAME

CROSS-REFERENCE TO RELATED APPLICATION

This application claims the priority benefit of Taiwan application serial no. 107132277, filed on Sep. 13, 2018. The entirety of the above-mentioned patent application is hereby incorporated by reference herein and made a part of this specification.

BACKGROUND OF THE INVENTION

Field of the Invention

The invention relates to a power control method, and particularly relates to a power control method for a storage device commonly accessed by a plurality of hosts and an electronic system using the same.

Description of Related Art

A conventional hard drive may only be connected to one host, and such a singular storage path results in a fact that the content in the hard drive cannot be accessed in case of a single point host failure, so that dual-port storage devices are developed. The dual-port storage device may provide a storage environment of high availability, and when one of the connected hosts is failed, the other connected host may still access data in the dual-port storage device.

Generally, the host may send a signal to control a power supply of the connected storage device. However, in order to avoid mutual interference of the two hosts controlling the power supply of the dual-port storage device to result in a fact that the dual-port storage device cannot be normally accessed, the power supply of the dual-port storage device is generally permanently activated and is not controlled by the hosts.

SUMMARY OF THE INVENTION

The invention is directed to a power control method for a storage device and an electronic system using the same, which are adapted to properly control a power supply of the storage device commonly accessed by a plurality of host, such that the multiple hosts are adapted to access the storage device smoothly.

An embodiment of the invention provides an electronic system including a storage device, a first host and a second host. The first host and the second host are all coupled to the storage device and configured to access the storage device. The first host includes a first controller, the first controller is coupled to the second host and the storage device, and determines to allow or prohibit the first host to control a power supply of the storage device according to a first computer state of the first host and a second computer state of the second host.

An embodiment of the invention provides a power control method adapted to an electronic system. The electronic system includes a storage device and a first host and a second host used for accessing the storage device. The power control method includes: providing a first controller to the first host, where the first controller is coupled to the second host and the storage device; obtaining a first computer state of the first host and a second computer state of the second host by the first controller; and determining to allow or prohibit the first host to control a power supply of the storage device according to the first computer state and the second computer state by the first controller.

Based on the above description, in the power control method for the storage device and the electronic system using the same of the embodiments of the invention, a control circuit is provided to each of the hosts, and the control circuit determines whether the host controls the power supply of the storage device by obtaining an operation state of the other host. The power supply of the storage device is finally controlled by the power supply control of all the hosts through an AND gate operation, so as to achieve power control of the hosts on the dual-port storage device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In embodiments of the invention, a controller is provided in each of hosts, and power control of a plurality of hosts are coordinated through the provided controllers, so as to properly control a power supply of a storage device without changing operations of an existing host system and the storage device, such that the hosts may smoothly access the storage device.

Figure 1:
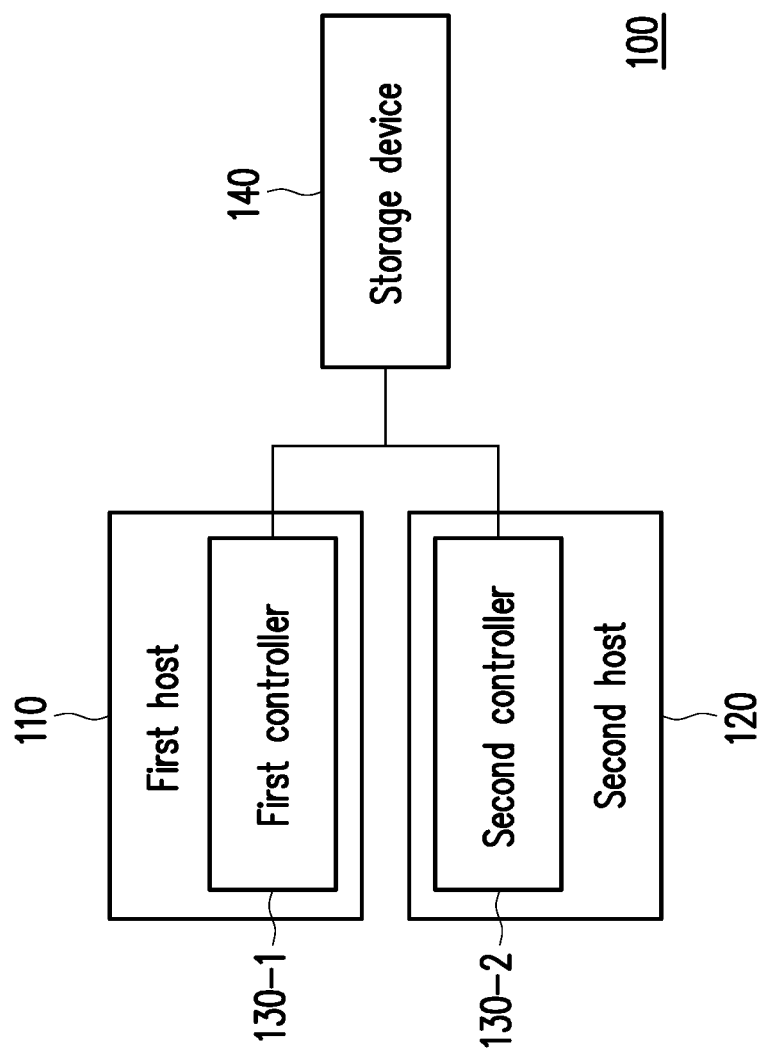
FIG. 1 is a block diagram of an electronic system according to an embodiment of the invention.

FIG. 1 is a block diagram of an electronic system according to an embodiment of the invention.

Referring to FIG. 1, the electronic system 100 includes a first host 110, a second host 120 and a storage device 140, the first host 110 further includes a first controller 130-1, and the second host 120 further includes a second controller 130-2. Since the electronic system 100 is a symmetric system, an operation of the first host 110 is similar to an operation of the second host 120, and operations of the first controller 130-1 and the second controller 130-2 are similar, so that only the first host 110 and the first controller 130-1 included therein are described in detail below.

In some embodiments, the first controller 130-1 may be implemented by a programmable logic device, for example, a Complex Programmable Logic Device (CPLD) or a Field Programmable Gate Array (FPGA), etc., though the invention is not limited by the invention. In some embodiments, the storage device 140 may be a dual-port non-volatile memory storage device, which is, for example, an NVMe hard drive adapted to connect to two hosts, though the invention is not limited thereto. It should be noted that the storage device 140 in the embodiment of FIG. 1 are commonly accessed by the first host 110 and the second host 120, though as long as the storage device 140 may be accessed by a plurality of hosts, the number of the hosts used for commonly accessing the storage device 140 is not limited by the invention.

The first host 110 and the second host 120 commonly access the storage device 140, and the first controller 130-1 may coordinate power control of the first host 110 and the second host 120 on the storage device 140, so as to avoid a situation that the first host 110 resets or turns off the power supply of the storage device 140 such that the second host 120 cannot access the storage device 140. To be more specific, the first controller 130-1 is connected to the second host 120 and the storage device 140, and is configured to obtain a first computer state of the first host 110 and a second computer state of the second host 120, and determines whether to allow or prohibit the first host 110 to control the power supply of the storage device 140 according to the first computer state and the second computer state.

In some embodiments, the computer states of the host, for example, include global system states such as states G0 to G3 or states S0 to S5. Those skilled in the art may learn details of each state in the global system states from specifications of an Advanced Configuration and Power Interface (ACPI), and details thereof are not repeated.

Generally, when the first computer state of the first host 110 is a turn-off state, (for example, the state G2, the state S5 or a soft off state, etc.), the first host 110 may send a turn-off signal to turn off the power supply of the storage device 140. If now the second host 120 is not in the turn-off state, the second host 120 cannot successfully access the storage device 140.

In order to avoid the above situation, in some embodiments, the first controller 130-1 monitors the first computer state of the first host 110 all the time, and when the first host 110 is not in the turn-off state, the first controller 130-1 releases a signal of the first host 110 used for controlling the power supply of the storage device 140, and when the first host 110 is switched to the turn-off state, the first controller 130-1 determines the second computer state of the second host 120 in real-time. In other words, the first controller 130-1 allows the first host 110 to control the power supply of the storage device 140 when the first host 110 and the second host 120 are all not in the turn-off state.

If the second computer state is not in the turn-off state when the first host 110 is switched to the turn-off state, the first controller 130-1 isolates the turn-off signal of the first host 110 used for turning off the power supply of the storage device 140, so as to avoid a situation that the storage device 140 is turned off by the first host 110. In other words, the first controller 130-1 prohibits the first host 110 to control the power supply of the storage device 140 when the first host 110 is in the turn-off state but the second host 120 is not in the turn-off state.

On the other hand, if the second computer state is also in the turn-off state when the first host 110 is switched to the turn-off state, the first controller 130-1 releases the turn-off signal of the first host 110 used for controlling the power supply of the storage device 140. In other words, the first controller 130-1 allows the first host 110 to control the power supply of the storage device 140 when the first host 110 and the second host 120 are all in the turn-off state.

Generally, when the first host 110 is in a reset process, the first host 110 may send a fundamental reset signal to reset power supplies of peripheral devices connected thereto. Now, if the fundamental reset signal resets the storage device 140, it probably results in a fact that the second host 120 original connected to the storage device 140 cannot successfully access the storage device 140. In order to avoid the above situation, in some embodiments, the first controller 130-1 may filter the fundamental reset signal coming from the first host 110 to avoid the situation that the storage device 140 is reset by the fundamental reset signal sent by the first host 110.

In some embodiments, the first host 110, for example, includes a Baseboard Management Controller (BMC), which may, for example, send a power control signal to the first controller 130-1. When the first controller 130-1 receives the power control signal coming from the BMC, the first controller 130-1 may control (for example, to turn off or reset) the power supply of the storage device 140 according to an instruction of the power control signal. The power control signal is, for example, a General-Purpose Input/Output (GPIO) signal or a serial signal, etc., which is not limited by the invention.

Operation details of the second controller 130-2 set to the second host 120 are similar to that of the first controller 130-1, and details thereof are not repeated. An embodiment is provided below to describe how to implement a power control method of the storage device 140 in the electronic system 100.

Figure 2:
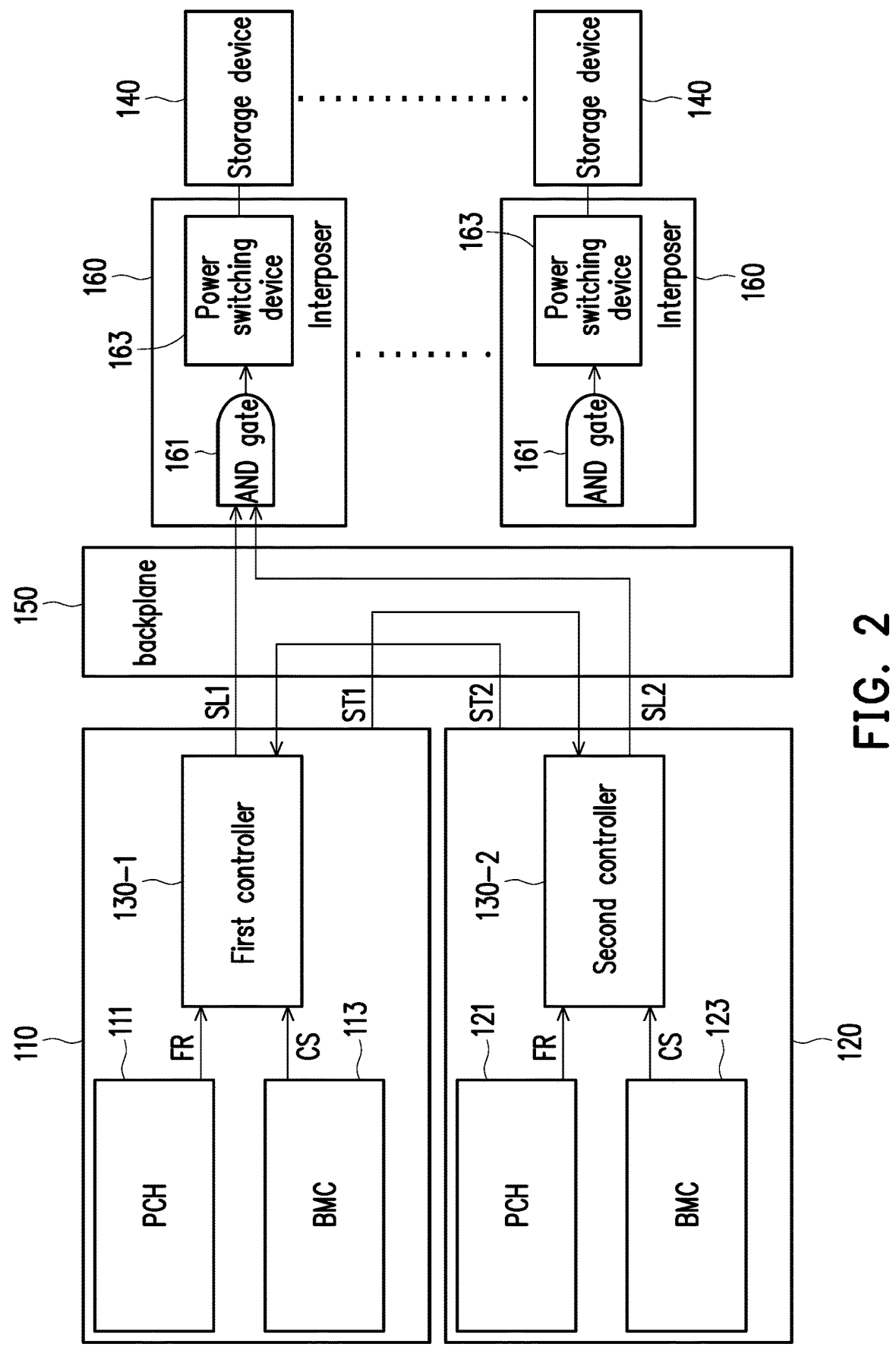
FIG. 2 is a block diagram of an electronic system according to an embodiment of the invention.

FIG. 2 is a block diagram of an electronic system according to an embodiment of the invention.

Referring to FIG. 2, in some embodiments, the first host 110 includes a Platform Controller Hub (PCH) 111, a BMC 113, and the first controller 130-1 is also disposed in the first host 110. The second host 120 also includes a PCH 121, a BMC 123, and the second controller 130-2 is also disposed in the second host 120. The first host 110 and the second host 120 are connected to the storage devices 140 and commonly access the storage devices 140 through interposers 160.

In some embodiments, the first host 110 and the second host 120 are connected to the interposers 160 through a backplane 150. In some embodiments, the first controller 130-1 is connected to the second host 120 through the backplane 150 to continuously obtain the second computer state ST2 of the second host 120, and the second controller 130-2 is connected to the first host 110 through the backplane 150 to continuously obtain the first computer state ST1 of the first host 110. Particularly, under such configuration, the backplane 150 of the electronic system 100 may not include any active component, and may also achieve control of the power supply of the storage device 140.

The interposers 160 are disposed corresponding to the storage devices 140, and are configured to respectively control the power supplies of the storage devices 140. In some embodiments, each of the interposers 160 includes an AND gate 161 and a power switching device 163.

A plurality of input terminals of the AND gate 160 are respectively connected to a plurality of controllers (for example, the first controller 130-1 and the second controller 130-2) to receive a plurality of signals (for example, a first signal SL1 and a second signal SL2) coming from the plurality of controllers, and an output terminal of the AND gate 160 is connected to the power switching device 163. The signals output by the controllers are, for example, digital signals, though the invention is not limited thereto.

The power switching device 163 receives the signal coming from the AND gate 161 to control the power supply of the storage device 140. For example, if the signal coming from the AND gate 161 has a high level (for example, 1), the power switching device 163 turns on the power supply of the storage device 140. Conversely, if the signal coming from the AND gate 161 has a low level (for example, 0), the power switching device 163 turns off the power supply of the storage device 140. In some embodiments, the power switching device 163 is, for example, implemented by eFuse, though the invention is not limited thereto.

In some embodiments, the first controller 130-1 may monitor the first computer state ST1 of the first host 110 and the second computer state ST2 of the second host 120 all the time, and when the first computer state ST1 is not the turn-off state, or the first computer state ST1 and the second computer state ST2 are all the turn-off state, the first controller 130-1 releases the signal of the first host 110 used for controlling the power supply of the storage device 140; the second controller 130-2 may monitor the second computer state ST2 of the second host 120 and the first computer state ST1 of the first host 110 all the time, and when the second computer state ST2 is not the turn-off state, or the first computer state ST1 and the second computer state ST2 are all the turn-off state, the second controller 130-2 releases the signal of the second host 120 used for controlling the power supply of the storage device 140. For example, when the first controller 130-1 determines that the first computer state ST1 is not the turn-off state or determines that the first computer state ST1 and the second computer state ST2 are all the turn-off state, the first signal SL1 output by the first controller 130-1 is the same with the signal of the first host 110 used for controlling the power supply of the storage device 140; and when the second controller 130-2 determines that the second computer state ST2 is not the turn-off state or determines that the first computer state ST1 and the second computer state ST2 are all the turn-off state, the second signal SL2 output by the second controller 130-2 is the same with the signal of the second host 120 used for controlling the power supply of the storage device 140.

On the other hand, when the first controller 130-1 determines that the first computer state ST1 is switched to the turn-off state but the second computer state ST2 is not the turn-off state, the first controller 130-1 may isolate the turn-off signal of the first host 110 used for turning off the power supply of the storage device 140. For example, when the first controller 130-1 determines that the first computer state ST1 is switched to the turn-off state but the second computer state ST2 is not the turn-off state, the first controller 130-1 may continuously output the first signal SL1 of a high level, such that the output of the AND gate 161 is determined by the second signal SL2, so as to avoid the situation that the power supply of the storage device 140 is turned off by the first host 110 when the first host 110 is switched to the turn-off state.

Similarly, when the second controller 130-2 determines that the second computer state ST2 is switched to the turn-off state but the first computer state ST1 is not the turn-off state, the second controller 130-2 may isolate the turn-off signal of the second host 120 used for turning off the power supply of the storage device 140, so as to avoid the situation that the storage device 140 is turned off by the second host 120. For example, when the second controller 130-2 determines that the second computer state ST2 is switched to the turn-off state but the first computer state ST1 is not the turn-off state, the second controller 130-2 may continuously output the second signal SL2 of the high level, such that the output of the AND gate 161 is determined by the first signal SL1, so as to avoid the situation that the power supply of the storage device 140 is turned off by the second host 120 when the second host 120 is switched to the turn-off state.

In some embodiments, the PCH 111 of the first host 110 sends a fundamental reset signal FR to reset the power supplies of the peripheral devices connected thereto during a reset process of the first host 110. The fundamental reset signal may be a low level pulse signal of a specific pulse period (for example, 10 ms), and such low level pulse signal makes the power switching device 163 to reset the power supply of the storage device 140. Therefore, a filter used for filtering the fundamental reset signal FR is configured in the first controller 130-1, so as to avoid the situation that the power switching device 163 receives the low level pulse signal of the specific pulse period in the fundamental reset signal FR. For example, the filter may be implemented based on a following equation:

$$\text{Output}(x) = \text{Input}(x) + \text{Input}(x-1) + \ldots + \text{Input}(x-s)$$

Where, s is an order of shift registers, which is positively related to a response speed of a signal rising edge. However, as long as the filter configured in the first controller 130-1 may filter the fundamental reset signal FR coming from the PCH 111, a detailed implementation method of the filter is not limited by the invention, and those skilled in the art may implement the filter according to an actual requirement. Therefore, the first controller 130-1 may avoid reset of the storage device 140 by the fundamental reset signal FR sent by the PCH 111 of the first host 110.

On the other hand, the PCH 121 of the second host 120 sends the fundamental reset signal FR to reset the power supplies of the peripheral devices connected thereto during a reset process of the second host 120. Therefore, the filter used for filtering the fundamental reset signal FR is also configured in the second controller 130-2, so as to avoid the situation that the power switching device 163 receives the low level pulse signal of the specific pulse period in the fundamental reset signal FR. Details of the filter in the second controller 130-2 are similar to the details of the filter in the first controller 130-1, so that details thereof are not repeated.

In some embodiments, the BMC 113 of the first host 110 may send a power control signal CS to the first controller 130-1. When the first controller 130-1 receives the power control signal CS coming from the BMC 113, the first controller 130-1 may output the first signal SL1 according to an instruction of the power control signal CS, so as to control (for example, to turn off or reset) the power supply of the storage device 140 according to the instruction of the power control signal CS.

In some embodiments, the BMC 123 of the second host 120 may send the power control signal CS to the second controller 130-2. When the second controller 130-2 receives the power control signal CS coming from the BMC 123, the second controller 130-2 may output the second signal SL2 according to an instruction of the power control signal CS, so as to control (for example, to turn off or reset) the power supply of the storage device 140 according to the instruction of the power control signal CS.

Figure 3:
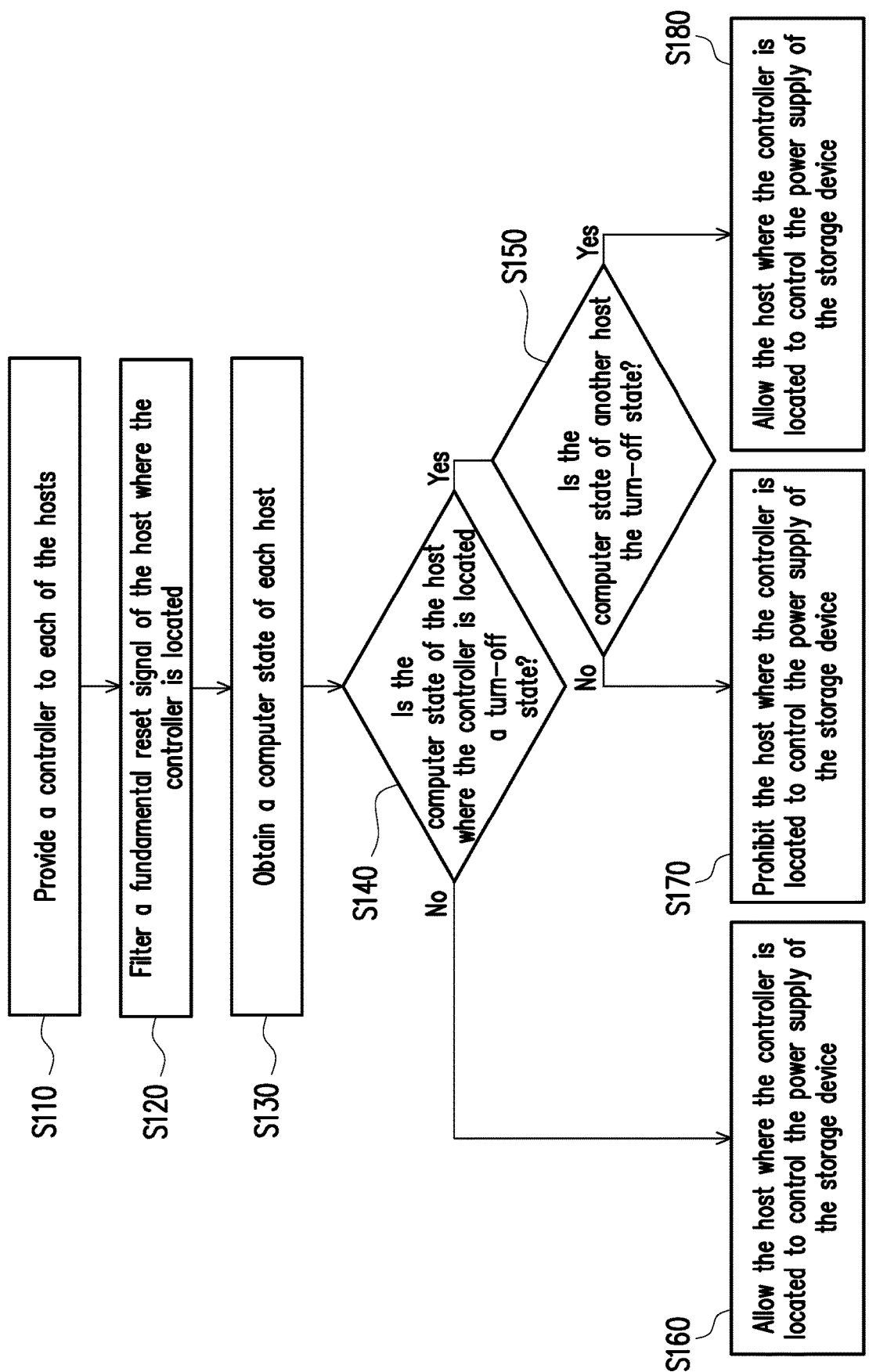
FIG. 3 is a flowchart illustrating a power control method according to an embodiment of the invention.

FIG. 3 is a flowchart illustrating a power control method according to an embodiment of the invention.

The power control method of the embodiment of FIG. 3 is adapted to the electronic system 100 of the embodiment of FIG. 1, so that description is performed below with reference of various components of the electronic system 100. It should be noted that details of a plurality of steps introduced in the aforementioned embodiments are not repeated.

Referring to FIG. 3, in step S110, a controller is provided to each of the hosts. Taking the first host 110 as an example, the first controller 130-1 is provided to the first host 110, and the provided first controller 130-1 is coupled to the second host 120 and the storage device 140. Since the operations of the first host 110 and the first controller 130-1 are the same with that of the second host 120 and the second controller 130-2, description of the operations of the second host 120 and the second controller 130-2 is not repeated.

In step S120, the controller may filter the fundamental reset signal of the host where the controller is located. Taking the first host 110 as an example, the first controller 130-1 is configured to filter the fundamental reset signal coming from the first host 110.

In step S130, the controller obtains a computer state of each of the hosts. Taking the first host 110 as an example, the first controller 130-1 may obtain the first computer state of the first host 110 and the second computer state of the second host 120.

In step S140, the controller determines whether the computer state of the host where the controller is located is the turn-off state. If yes, a step S150 is executed, and if not, a step S160 is executed to allow the host where the controller is located to control the power supply of the storage device 140. Taking the first host 110 as an example, the first controller 130-1 may determine whether the first computer state is the turn-off state. If the first controller 130-1 determines that the first computer state is the turn-off state in the step S140, the step S150 is executed. Conversely, if the first controller 130-1 determines that the first computer state is not the turn-off state in the step S140, the step S160 is executed to allow the first host 110 to control the power supply of the storage device 140.

In step S150, the controller further determines whether the computer state of another host is the turn-off state. If yes, a step S180 is executed to allow the host where the controller is located to control the power supply of the storage device 140. Conversely, a step S170 is executed to prohibit the host where the controller is located to control the power supply of the storage device 140. Taking the first host 110 as an example, the first controller 130-1 further determines whether the second computer state is the turn-off state. If the first controller 130-1 determines that the second computer state is the turn-off state in the step S150, the flow enters the step S180 to allow the first host 110 to control the power supply of the storage device 140. Conversely, if the first controller 130-1 determines that the second computer state is not the turn-off state in the step S150, the flow enters the step S170 to prohibit the first host 110 to control the power supply of the storage device 140.

In summary, in the power control method for the storage device and the electronic system using the same of the embodiments of the invention, controllers are provided between a plurality of hosts and the storage device to coordinate the power control of the hosts on the storage device. In some embodiments, when one host is in the turn-off state and there is another host that is not in the turn-off state, the controller may prohibit the host in the turn-off state to control the power supply of the storage device. In some embodiments, when one host sends the fundamental reset signal to the peripheral device thereof due to reset, the controller may filter the fundamental reset signal to avoid resetting the power supply of the storage device. In this way, the power supply of the storage device may be properly controlled without changing the existing host system and the operation of the storage device, such that multiple hosts may successfully access the storage device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic system, comprising:
   a storage device;
   a first host, coupled to the storage device and configured to access the storage device; and
   a second host, coupled to the storage device and configured to access the storage device,
   wherein the first host comprises a first controller, the first controller is coupled to the second host and the storage device, and determines to allow or prohibit the first host to control a power supply of the storage device according to whether a first computer state of the first host and a second computer state of the second host are in a turn-off state.

2. The electronic system as claimed in claim 1, wherein the first controller filters a fundamental reset signal of the first host.

3. The electronic system as claimed in claim 1, wherein when the first computer state is a turn-off state and the second computer state is not the turn-off state, the first controller prohibits the first host to control the power supply of the storage device.

4. The electronic system as claimed in claim 3, further comprising:
   a power switching device, configured to switch the power supply of the storage device; and
   an AND gate, wherein input terminals of the AND gate are coupled to the first controller and a second controller, and an output terminal of the AND gate is coupled to the power switching device,
   wherein the first controller prohibits the first host to control the power supply of the storage device by outputting a high level signal to the AND gate.

5. The electronic system as claimed in claim 1, wherein the first host comprises a baseboard management controller, wherein the baseboard management controller is coupled to the first controller, and is configured to send a power control signal, wherein the first controller controls the power supply of the storage device according to the power control signal.

6. A power control method, adapted to an electronic system, wherein the electronic system comprises a storage device and a first host and a second host used for accessing the storage device, the power control method comprising:
   providing a first controller to the first host, wherein the first controller is coupled to the second host and the storage device;
   obtaining a first computer state of the first host and a second computer state of the second host by the first controller; and
   determining to allow or prohibit the first host to control a power supply of the storage device according to whether the first computer state and the second computer state by the first controller are in a turn-off state.

7. The power control method as claimed in claim 6, further comprising:
   filtering a fundamental reset signal of the first host by the first controller.

8. The power control method as claimed in claim 6, wherein the step of determining to allow or prohibit the first host to control a power supply of the storage device according to the first computer state and the second computer state by the first controller comprises:
   when the first controller detects that the first computer state is a turn-off state and the second computer state is not the turn-off state, prohibiting the first host to control the power supply of the storage device.

9. The power control method as claimed in claim 8, further comprising:

providing an AND gate, wherein input terminals of the AND gate are coupled to the first controller and a second controller, and an output terminal of the AND gate is coupled to a power switching device used for switching the power supply of the storage device, wherein the step of prohibiting the first host to control the power supply of the storage device by the first controller comprises:

outputting a high level signal to the AND gate to prohibit the first host to control the power supply of the storage device.

10. The power control method as claimed in claim 6, wherein the first host comprises a baseboard management controller, and the controller is coupled to the baseboard management controller, and the power control method further comprises:

sending a power control signal to the first controller by the baseboard management controller; and controlling the power supply of the storage device by the first controller according to the power control signal coming from the baseboard management controller.

* * * * *